(12) United States Patent
Zhang et al.

(10) Patent No.: US 8,694,847 B2
(45) Date of Patent: Apr. 8, 2014

(54) SYSTEMS AND METHODS FOR SECTOR QUALITY DETERMINATION IN A DATA PROCESSING SYSTEM

(75) Inventors: Fan Zhang, Milpitas, CA (US); Yang Han, Sunnyvale, CA (US); Xuebin Wu, San Jose, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/597,026

(22) Filed: Aug. 28, 2012

(65) Prior Publication Data

US 2014/0068394 A1   Mar. 6, 2014

(51) Int. Cl.
*H03M 13/00* (2006.01)
*H04L 1/18* (2006.01)
*G06F 11/00* (2006.01)

(52) U.S. Cl.
USPC .......... 714/751; 714/752; 714/755; 714/758; 714/759; 714/800; 714/807

(58) Field of Classification Search
None
See application file for complete search history.

(56) References Cited

U.S. PATENT DOCUMENTS

| | | | |
|---|---|---|---|
| 5,878,098 A * | 3/1999 | Wang et al. | 375/377 |
| 7,113,356 B1 | 9/2006 | Wu | |
| 7,725,809 B2 * | 5/2010 | Adachi et al. | 714/795 |
| 8,161,361 B1 * | 4/2012 | Song et al. | 714/795 |
| 8,359,527 B1 * | 1/2013 | Song et al. | 714/795 |
| 8,413,010 B1 * | 4/2013 | Vasquez et al. | 714/758 |
| 8,433,968 B2 * | 4/2013 | Gotman et al. | 714/751 |
| 8,499,227 B2 * | 7/2013 | Liikanen et al. | 714/786 |
| 2006/0193406 A1 * | 8/2006 | Adachi et al. | 375/341 |
| 2006/0256670 A1 | 11/2006 | Park | |
| 2010/0214895 A1 * | 8/2010 | Miyashita et al. | 369/53.31 |
| 2011/0164669 A1 | 7/2011 | Mathew | |
| 2011/0231725 A1 * | 9/2011 | Gotman et al. | 714/748 |
| 2012/0079353 A1 * | 3/2012 | Liikanen et al. | 714/773 |

OTHER PUBLICATIONS

U.S. Appl. No. 13/561,230, Unpublished (filed Jul. 30, 2012) (Fan Zhang).
U.S. Appl. No. 13/558,245, Unpublished (filed Jul. 25, 2012) (Fan Zhang).
U.S. Appl. No. 13/560,702, Unpublished (filed Jul. 27, 2012) (Fan Zhang).
U.S. Appl. No. 13/552,403, Unpublished (filed Jul. 18, 2012) (Fan Zhang).
U.S. Appl. No. 13/400,750, Unpublished (filed Feb. 21, 2012) (Fan Zhang).
U.S. Appl. No. 138433,742, Unpublished (filed Mar. 29, 2012) (Fan Zhang).
U.S. Appl. No. 13/342,240, Unpublished (filed Jan. 3, 2012) (Shaohua Yang).
U.S. Appl. No. 13/316,953, Unpublished (filed Dec. 12, 2011) (Haitao Xia).
U.S. Appl. No. 13/340,974, Unpublished (filed Dec. 30, 2011) (Dan Liu).
U.S. Appl. No. 13/445,848, Unpublished (filed Apr. 12, 2012) (Bruce Wilson).
U.S. Appl. No. 13/251,342, Unpublished (filed Oct. 3, 2011) (Haitao Xia).

\* cited by examiner

*Primary Examiner* — Guerrier Merant
(74) *Attorney, Agent, or Firm* — Hamilton DeSanctis & Cha

(57) ABSTRACT

The present inventions are related to systems and methods for data processing, and more particularly to systems and methods for data set quality determination.

20 Claims, 6 Drawing Sheets

US 8,694,847 B2

SYSTEMS AND METHODS FOR SECTOR QUALITY DETERMINATION IN A DATA PROCESSING SYSTEM

BACKGROUND OF THE INVENTION

The present inventions are related to systems and methods for data processing, and more particularly to systems and methods for data set quality determination.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. In most cases, each data set is treated similarly even though some data sets are more likely to yield an original information set than another. In some cases, it has been determined that there is an advantage to treating data sets differently depending upon the quality of the given data set.

Hence, for at least the aforementioned reasons, there exists a need in the art for advanced systems and methods for identifying the quality of different data sets in a data processing system.

BRIEF SUMMARY OF THE INVENTION

The present inventions are related to systems and methods for data processing, and more particularly to systems and methods for data set quality determination.

Various embodiments of the present invention provide data processing systems that include a data decoder circuit, and a quality metric calculation circuit. The data decoder circuit is operable to apply a data decode algorithm to a decoder input derived from a data set to yield a decoded output. The decoded output includes an unsatisfied check, and soft data associated with the unsatisfied check. The quality metric calculation circuit is operable to calculate a decode quality metric corresponding to the data set using the soft data.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for data set quality determination.

Figure 3A:
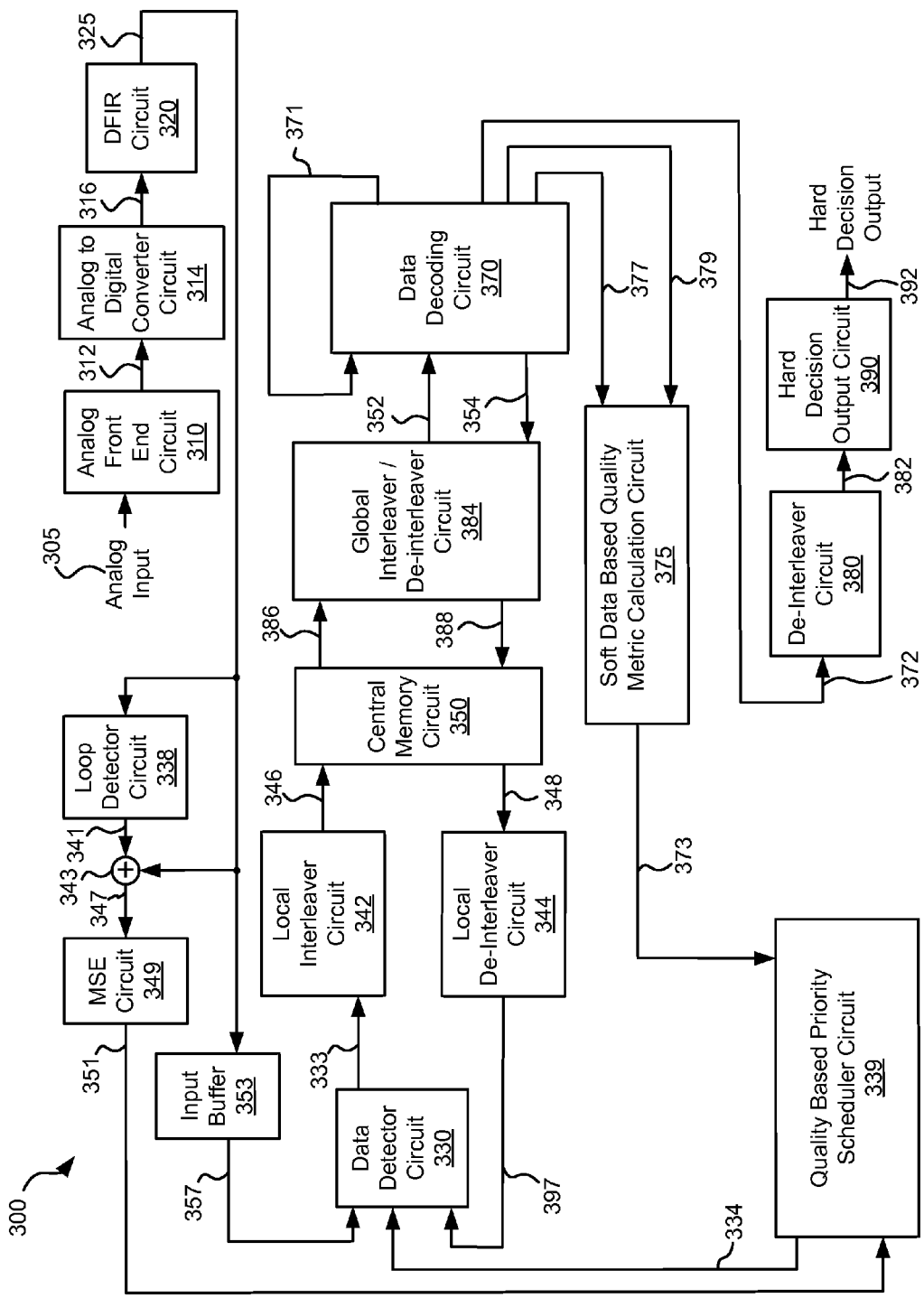
FIG. 3a shows a data processing circuit including a soft data based quality metric calculation circuit in accordance with some embodiments of the present invention.

Various embodiments of the present invention provide for sector quality calculation. Such sector quality calculation relies on soft data available from either a data decoder circuit or a data detector circuit included in a data processing circuit. The sector quality calculation is enhanced compared to prior sector quality calculations that relied on a number of unsatisfied checks remaining after application of a data decoding algorithm by a data decoder circuit. Such enhanced sector quality calculation improves an ability to discern between the quality of different data sets and thereby yields a more reliable measure of sector quality. In FIG. 3a below an embodiment is described where the result of the sector quality calculation is used for scheduling. It should be noted that the result of the sector quality calculation may be used for purposes other than scheduling.

Various embodiments of the present invention provide data processing systems that include a data decoder circuit, and a quality metric calculation circuit. The data decoder circuit is operable to apply a data decode algorithm to a decoder input derived from a data set to yield a decoded output. The decoded output includes an unsatisfied check, and soft data associated with the unsatisfied check. The quality metric calculation circuit is operable to calculate a decode quality metric corresponding to the data set using the soft data.

In some instances of the aforementioned embodiments, the systems further include a data detector circuit operable to apply a data detection algorithm to the data set to yield a detected output, wherein the decoder input is derived from the detected output. In various instances of the aforementioned embodiments, the data detector circuit may be, but is not limited to, a Viterbi algorithm data detector circuit, or a maximum a posteriori data detector circuit. In some instances of the aforementioned embodiments, calculating the quality metric corresponding to the data set includes using the soft data to calculate a contribution from each variable node associated with the unsatisfied check to yield a local metric. In some cases, the local metric is a first local metric, the unsatisfied check is a first unsatisfied check, and calculating the decode quality metric corresponding to the data set further includes: using the soft data to calculate a contribution from each variable node associated with the second unsatisfied check to yield a second local metric; and summing a first interim metric derived from the first local metric and a second interim metric derived form the second local metric to yield the decode quality metric. In some such cases, the quality metric calculation circuit is further operable to: normalize the first local metric to a number of variable nodes corresponding the first unsatisfied check to yield the first interim metric; and normalize the second local metric to a number of variable nodes corresponding the second unsatisfied check to yield the second interim metric.

Figure 1:
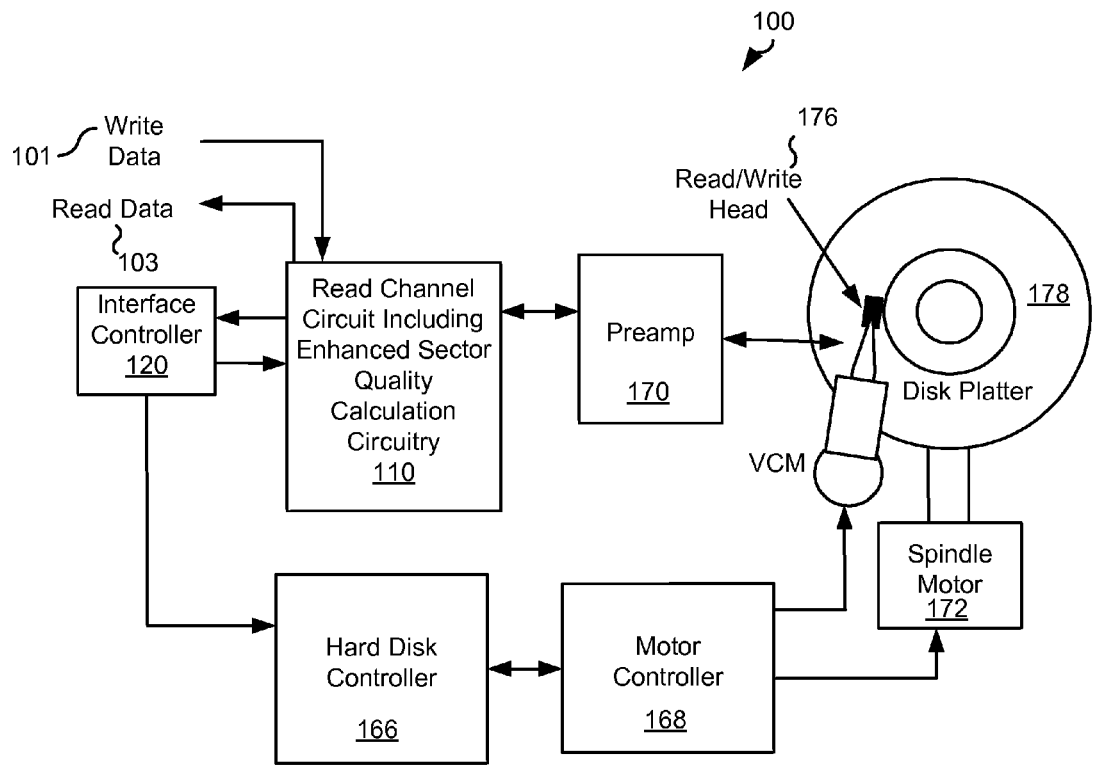
FIG. 1 shows a storage system including enhanced sector quality calculation circuitry in accordance with various embodiments of the present invention.

Turning to FIG. 1, a storage system 100 including a read channel circuit 110 having enhanced sector quality calculation circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a data processing circuit having a sector quality calculation circuit. The sector quality calculation circuit calculates a quality metric for received sectors of data. The quality metrics may be compared one with another to indicate a relative quality of the respective quality metrics. This relative quality information may be used for one or more processing purposes including, but not limited to, scheduling of the various sectors of data through the data processing circuit. In some cases, read channel circuit 110 may be implemented to include a data processing circuit similar to that discussed below in relation to FIG. 3a-3b. Further, the data processing including sector quality calculation may be accomplished consistent with one of the approaches discussed below in relation to FIGS. 4a-4c.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
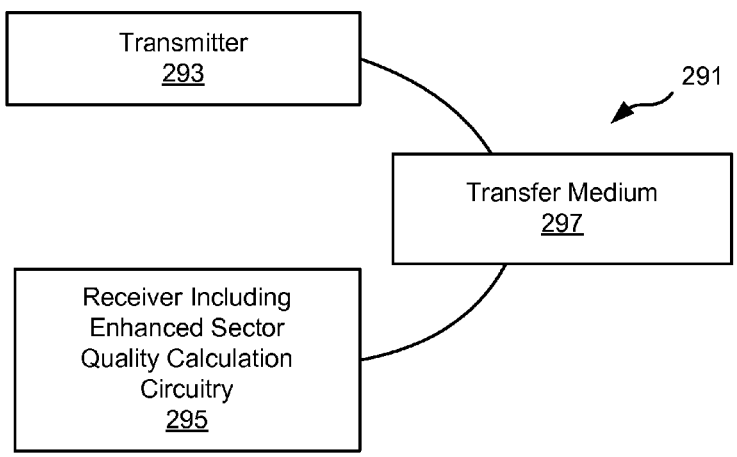
FIG. 2 depicts a data transmission system including enhanced sector quality calculation circuitry in accordance with one or more embodiments of the present invention.

Turning to FIG. 2, a data transmission system 291 including a receiver 295 having quality based priority scheduling circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data. As part of processing the received information, receiver 295 utilizes a data processing circuit having a sector quality calculation circuit. The sector quality calculation circuit calculates a quality metric for received sectors of data. The quality metrics may be compared one with another to indicate a relative quality of the respective quality metrics. This relative quality information may be used for one or more processing purposes including, but not limited to, scheduling of the various sectors of data through the data processing circuit. In some cases, receiver 295 may be implemented to include a data processing circuit similar to that discussed below in relation to FIG. 3a-3b. Further, the data processing including sector quality calculation may be accomplished consistent with one of the approaches discussed below in relation to FIGS. 4a-4c.

FIG. 3a shows a data processing circuit 300 including a soft data based quality metric calculation circuit 375 in accordance with some embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter (DFIR) circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain one or more codewords until processing of that codeword is completed through a data detector circuit 330 and a data decoding circuit 370 including, where warranted, multiple global iterations (passes through both data detector circuit 330 and data decoding circuit 370) and/or local iterations (passes through data decoding circuit 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once a data decoding circuit 370 is available, a previously stored interleaved codeword 346 is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 into data decoding circuit 370. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 370 applies a data decode algorithm to decoder input 352 to yield a decoded output 371. In cases where another local iteration (i.e., another pass trough data decoder circuit 370) is desired, data decoding circuit 370 re-applies the data decode algorithm to decoder input 352 guided by decoded output 371. This continues until either a maximum number of local iterations is exceeded or decoded output 371 converges.

Where decoded output 371 fails to converge (i.e., fails to yield the originally written data set) and a number of local iterations through data decoder circuit 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order. The originally ordered data sets are then provided as a hard decision output 392.

As equalized output 325 is being stored to input buffer 353, a detect quality metric 351 of equalized output 325 is being determined. In particular, equalized output 325 is provided to a loop detector circuit 338 that applies a data detection algorithm to equalized output 325 to yield a detected output 341. In some embodiments of the present invention, loop detector circuit 338 is a simplified version of data detector circuit 330 that is operable to provide detected output 341 as a rough approximation of what detected output 333 will be when data detector circuit 330 applies the data detection algorithm to the same equalized output 325 pulled from input buffer 353. Based upon the disclosure provided herein, one of ordinary skill in the art will recognize a variety of data detector circuits that may be used in relation to different embodiments of the present invention. Detected output 341 is provided to a summation circuit 343 that is operable to subtract equalized output 325 from corresponding instances of detected output 341 to yield a series of error values 347.

Error values 347 are provided to a mean squared error (MSE) calculation circuit 349 that calculates a mean squared error across each codeword received as equalized output 325. The mean squared error value is provided as detect quality metric 351 to quality based priority scheduler circuit 339. In such a case, a higher value of detect quality metric 351 indicates a lower quality. The mean squared error value is calculated in accordance with mean squared error calculations as are known in the art. Alternatively, another error calculation may be used such as, for example, an average error value across the entire codeword. Based upon the disclosure provided herein, one of ordinary skill in the art will recognize a variety of error calculations that may be used in relation to different embodiments of the present invention.

Figure 3B:
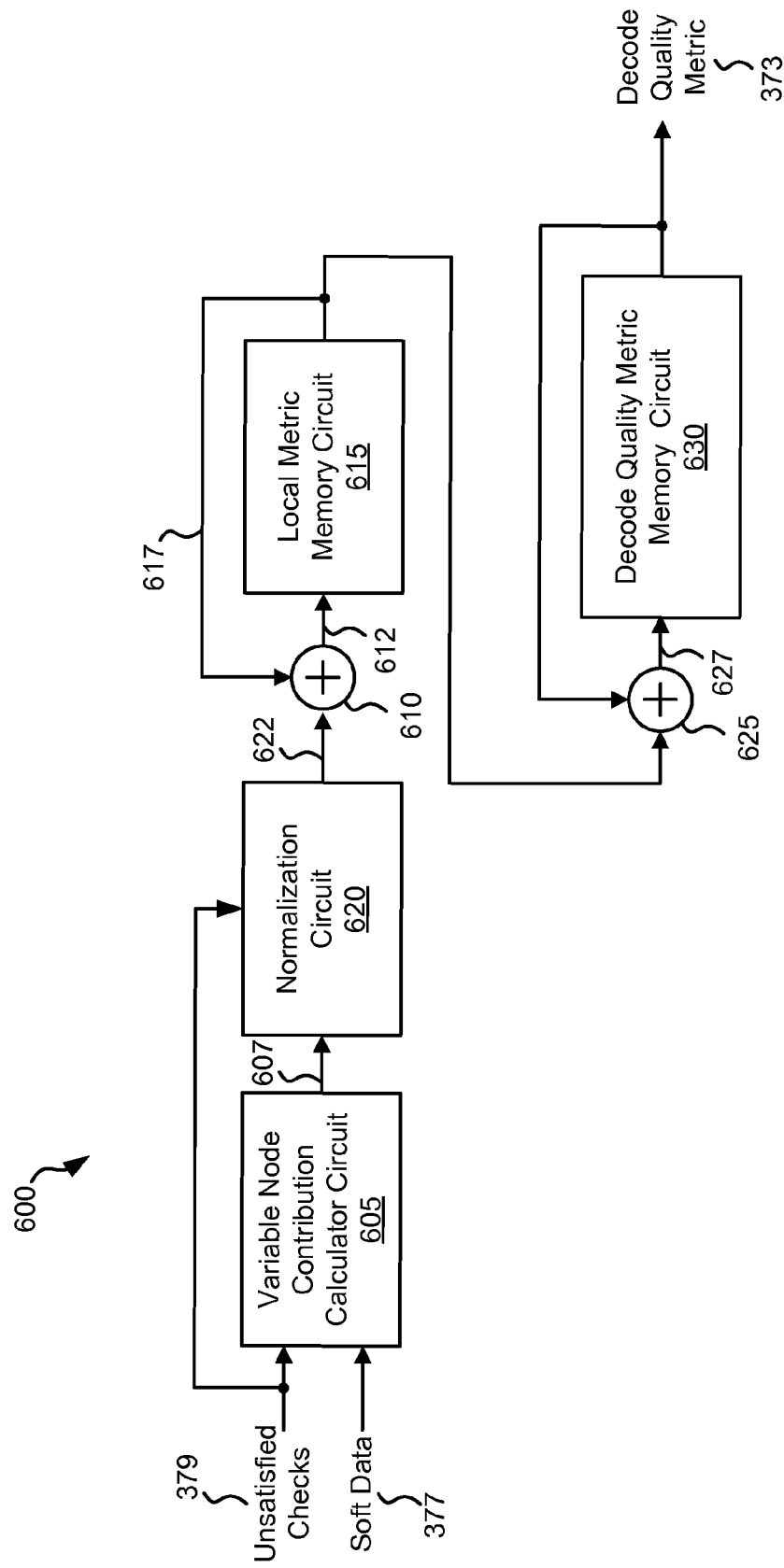
FIG. 3b shows one possible implementation of the soft data based quality metric calculation circuit of FIG. 3a in accordance with some embodiments of the present invention.

In addition, as codewords are processed through data decoding circuit 370 soft data 377 from decoded output 371 that correspond to unsatisfied checks 379 (i.e., parity equations that could not be satisfied by the decoding algorithm) or errors in the codeword are reported to soft data based quality metric calculation circuit 375. Quality metric calculation circuit 375 uses the received unsatisfied checks 379 and soft data 377 to calculate a decode quality metric 373. FIG. 3b shows a circuit 600 that may be used to implement soft data based quality metric calculation circuit 375.

Turning to FIG. 3b, circuit 600 includes a variable node contribution circuit 605. Variable node contribution circuit 605 initializes a local metric value to zero and an updated local metric value to zero, and then updates the local metric using soft data 377 corresponding to each variable node of an unsatisfied check 379. As part of this, the variable node corresponding to the current unsatisfied check with the smallest soft data value (i.e., the variable node that is most likely incorrect) is identified, and the hard decision associated with the variable node is flipped, and the sign of the soft data is changed. For example, for a binary decoded output, the hard decision is switched from 0 to 1, or from 1 to 0. In some cases where the soft data extends from −30 to +30, the sign of the soft data is switched. In contrast, where the soft data extends from, for example 0 to 60, instead of changing the sign of the soft data, a mid value (e.g., 30) is subtracted from the soft data value, the sign is then changed, and then the mid value is re-added to yield the updated value.

In addition, variable node contribution circuit 605 generates a soft data offset corresponding to hard decision of the variable node by assigning a maximum value as the soft data offset where the hard decision is equal to zero, and assigning a minimum value as the soft data offset where the hard decision is equal to one. Thus, for example, where the value of the soft data extends from −30 to +30, the soft data offset is set equal to +30 where the hard decision is zero, or the soft data offset is set equal to −30 where the hard decision is one. Then, the soft data offset is subtracted from the soft data to yield a sum. This sum is then added to the local metric in accordance with the following equation:

Local Metric=Local Metric+Soft Data Value−Soft Data Offset.

This local metric value is provided as a local metric 607 to a normalization circuit 620 that normalizes it to the number of variable nodes in the current unsatisfied check to yield a normalized local metric 622 in accordance with the following equation:

Normalized Local Metric 622=Updated Local Metric 617/No. of USCs/Amplitude, where No. of USCs is the total number of unsatisfied checks remaining in decoded output 371, and Amplitude is the amplitude (i.e., range) of the soft data (e.g., 60 where the soft data extends from −30 to +30).

The processes of variable node contribution circuit 605 and normalization circuit 607 repeated for each variable node associated with an unsatisfied check. Normalized local metric 622 is provided as an interim output to a summation circuit 610 that adds it to an updated local metric 617 to yield a sum value 612. Sum value 612 is maintained by a local metric accumulator memory 615 that provides it as updated local metric 617.

Updated local metric 617 for each unsatisfied check in decoded output 371 are accumulated by adding them to an existing decode quality metric 373 from a decode quality metric memory circuit 630 that is initialized as zero for each decoded output 371. In particular, updated local metric 617 is provided to a summation circuit 610 that sums it with decode quality metric 373 to yield a sum value 627. Sum value 627 is stored to decode quality metric memory circuit 630.

The following pseudocode describes the operation of circuit 600:

```
Initialize local metric to zero
For each unsatisfied check {
    initialize local metric to zero
    identify the variable node having the smallest soft data;
    flip the hard decision from the variable node;
    change the sign of the soft data;
    For each variable node of the current unsatisfied check {
        If hard decision of the variable node equals zero {
            set soft data offset equal to maximum;
        }
        Else if hard decision of the variable node equals one {
            set soft data offset equal to minimum;
        }
        normalize the local metric to the number of variable nodes
corresponding to the unsatisfied check;
        updated local metric = normalized local metric + soft data value −
        soft data offset;
    }
    decode quality metric = decode quality metric + updated local metric;
}
```

Returning to FIG. 3a, quality based priority scheduler circuit 339 uses detect quality metric 351 and decode quality metric 373 to select the next codeword to be processed by data detector circuit 330 when it becomes available. In particular, the next codeword is either a previously unprocessed codeword from input buffer 353 that is processed by data detector circuit 330 without guidance from de-interleaved output 397 derived from central memory circuit 350, or a previously processed codeword from input buffer 353 that is processed by data detector circuit 330 with guidance from de-interleaved output 397 derived from central memory circuit 350. The selection is indicated to data detector circuit 330 by a codeword selector output 334.

In one particular embodiment of the present invention, quality based priority scheduler circuit 339 causes data detector circuit 330 to select a previously processed codeword from input buffer 353 that is processed by data detector circuit 330 with guidance from de-interleaved output 397 derived from central memory circuit 350 where a decoded output is available and ready for data detection in central memory circuit 350. In such a case, where two or more decoded outputs are available and ready for data detection in central memory circuit 350, quality based priority scheduler circuit 339 selects the decoded output to be provided as de-interleaved output 397 that exhibits the lowest value of decode quality metric 373. Alternatively, where no decoded outputs are available and ready for data detection in central memory circuit 350, quality based priority scheduler circuit 339 causes data detector circuit 330 to select a previously unprocessed codeword from input buffer 353. In such a case, where two or more previously unprocessed codewords are available in input buffer 353, quality based priority scheduler circuit 339 selects the codeword to be processed that exhibits the lowest value of detect quality metric 351. Based upon the disclosure provided herein, one of ordinary skill in the art will recognize a variety of other priority algorithms that may be implemented by quality based priority scheduler circuit 339 in accordance with different embodiments of the present invention.

Figure 4A:
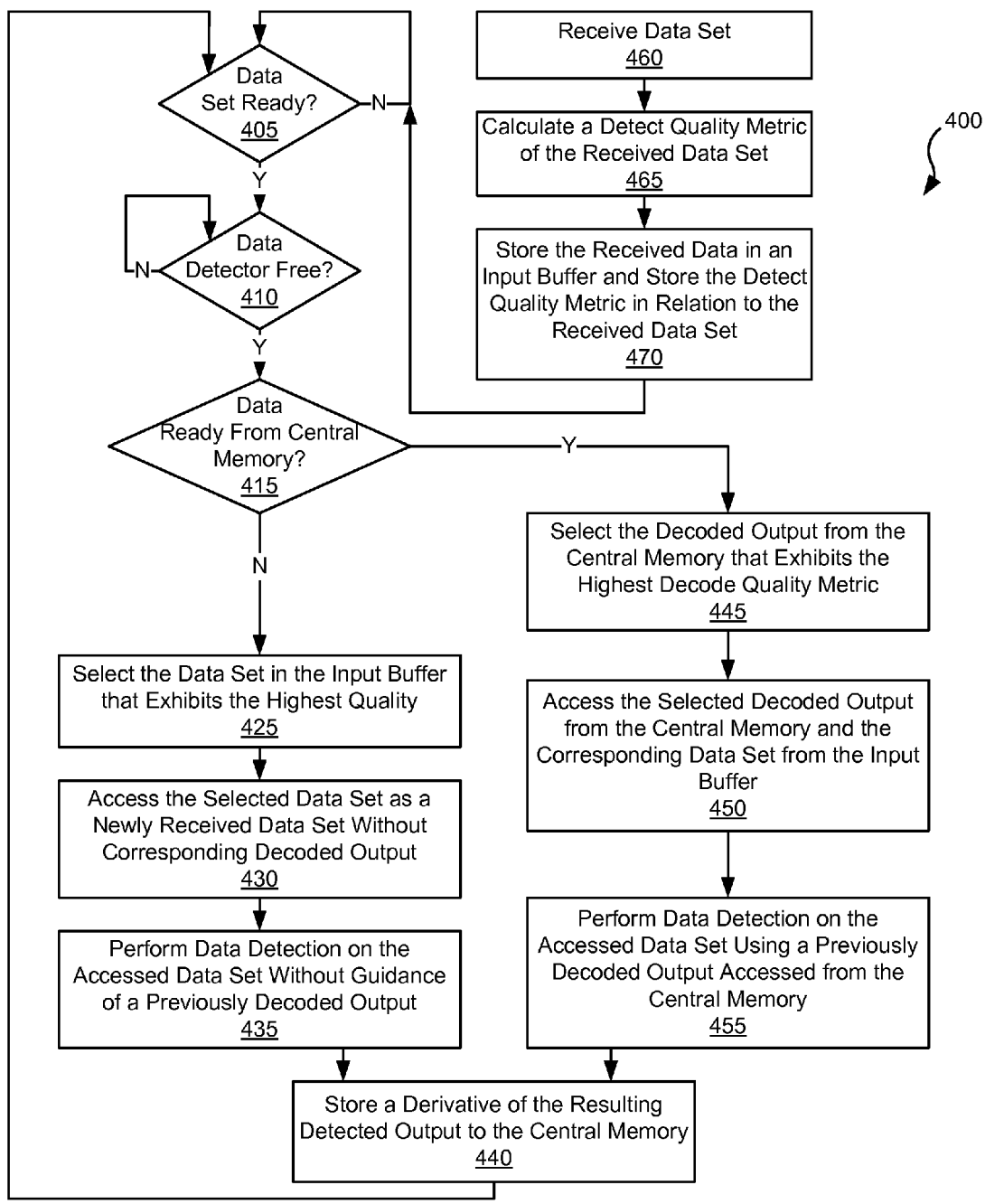
FIGS. 4a-4c are flow diagrams showing a method for data processing including enhanced sector quality calculation in accordance with some embodiments of the present invention.

FIG. 4a is a flow diagram 400 showing a method for quality based priority in applying a data detection algorithm as part of data processing in accordance with some embodiments of the present invention. Following flow diagram 400 a data set is received (block 460). This data set may be received, for example, from a storage medium or a communication medium. In some cases, the data set is a sector of data. As the data set is received, a detect quality metric is calculated for the data set (block 465). This calculation may include, for example, applying a data detection algorithm or processed to the data set to yield a detected output, and subtracting the detected output from corresponding instances of the received data set to yield an error. The resulting series of errors are then used to calculate a mean squared error value across a number of instances corresponding to a codeword. The mean squared error value is the detect quality metric. Based upon the disclosure provided herein, one of ordinary skill in the art will recognize other priority metrics that may be used in relation to different embodiments of the present invention. The received data set is stored in an input buffer and the detect quality metric is stored in relation to the received data set (block 470).

It is repeatedly determined whether a data set is ready for processing (block 405). A data set may become ready for processing where either the data set was previously processed and a data decode has completed in relation to the data set and the respective decoded output is available in a central memory, or where a previously unprocessed data set becomes available in the input buffer. Where a data set is ready (block 405), it is determined whether a data detector circuit is available to process the data set (block 410).

Where the data detector circuit is available for processing (block 410), it is determined whether there is a decoded output in the central memory that is ready for additional processing (block 415). Where there is not a decoded output in the central memory (block 415), the data set in the input buffer that exhibits the highest quality is selected (block 425). The highest quality is the data set that corresponds to the detect quality metric with the lowest value. In some cases, only one previously unprocessed data set is available in the input buffer. In such cases, the only available data set is selected. The selected data set is accessed from the input buffer (block 430) and a data detection algorithm is applied to the newly received data set (i.e., the first global iteration of the data set) without guidance of a previously decoded output (block 435). In some cases, the data detection algorithm is a Viterbi algorithm data detector circuit or a maximum a posteriori data detector circuit. Application of the data detection algorithm yields a detected output. A derivative of the detected output is stored to the central memory (block 440). The derivative of the detected output may be, for example, an interleaved or shuffled version of the detected output.

Alternatively, where a decoded output is available in the central memory and ready for additional processing (bock 415), the available decoded output in the central memory that exhibits the highest quality is selected (block 445). The highest quality is the decoded output that corresponds to the best decode quality metric (see block 441 of FIG. 4b). In some cases, only one decoded output is available in the central memory. In such cases, the only available decoded output is selected.

Figure 4B:
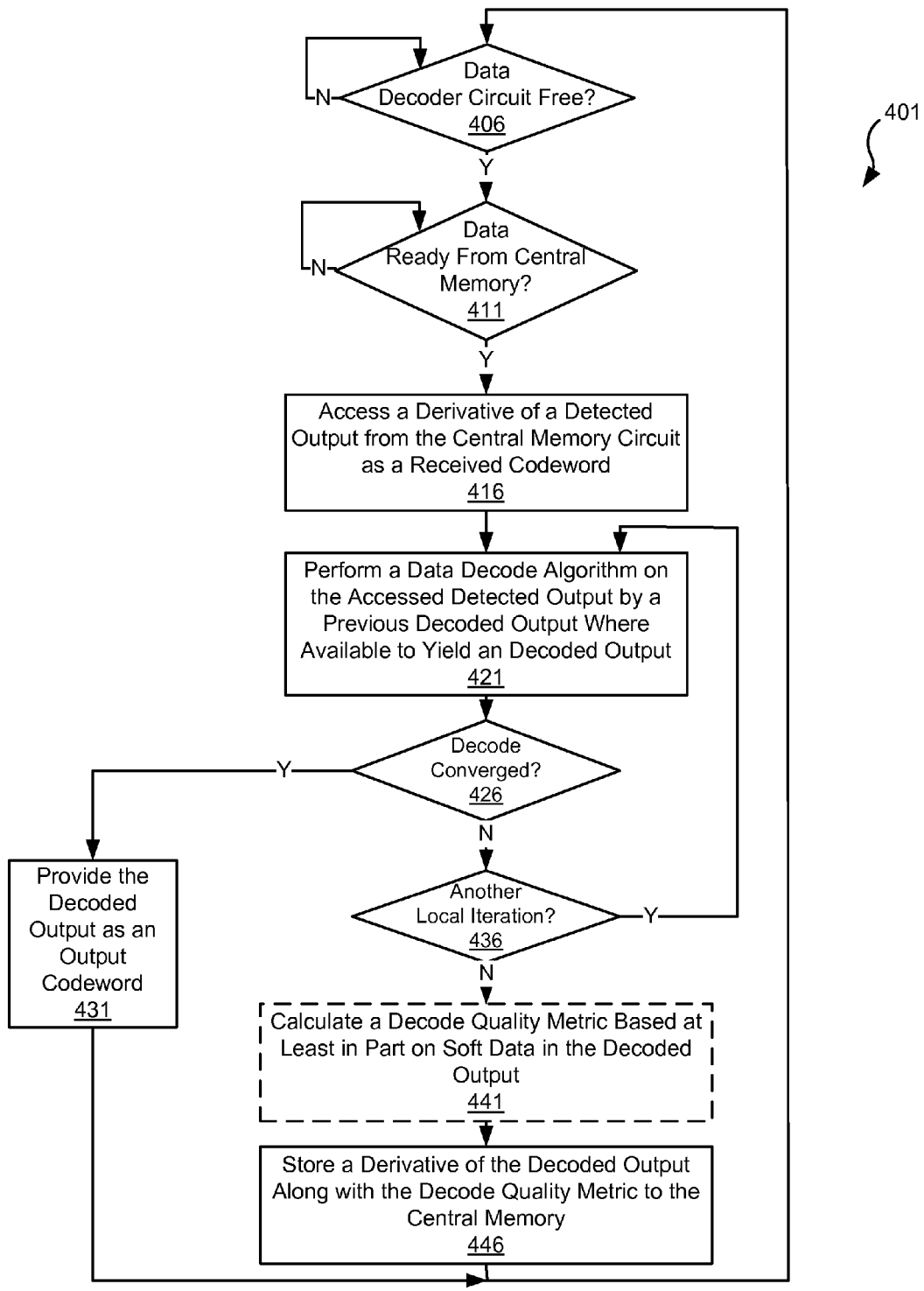
Figure 4C:
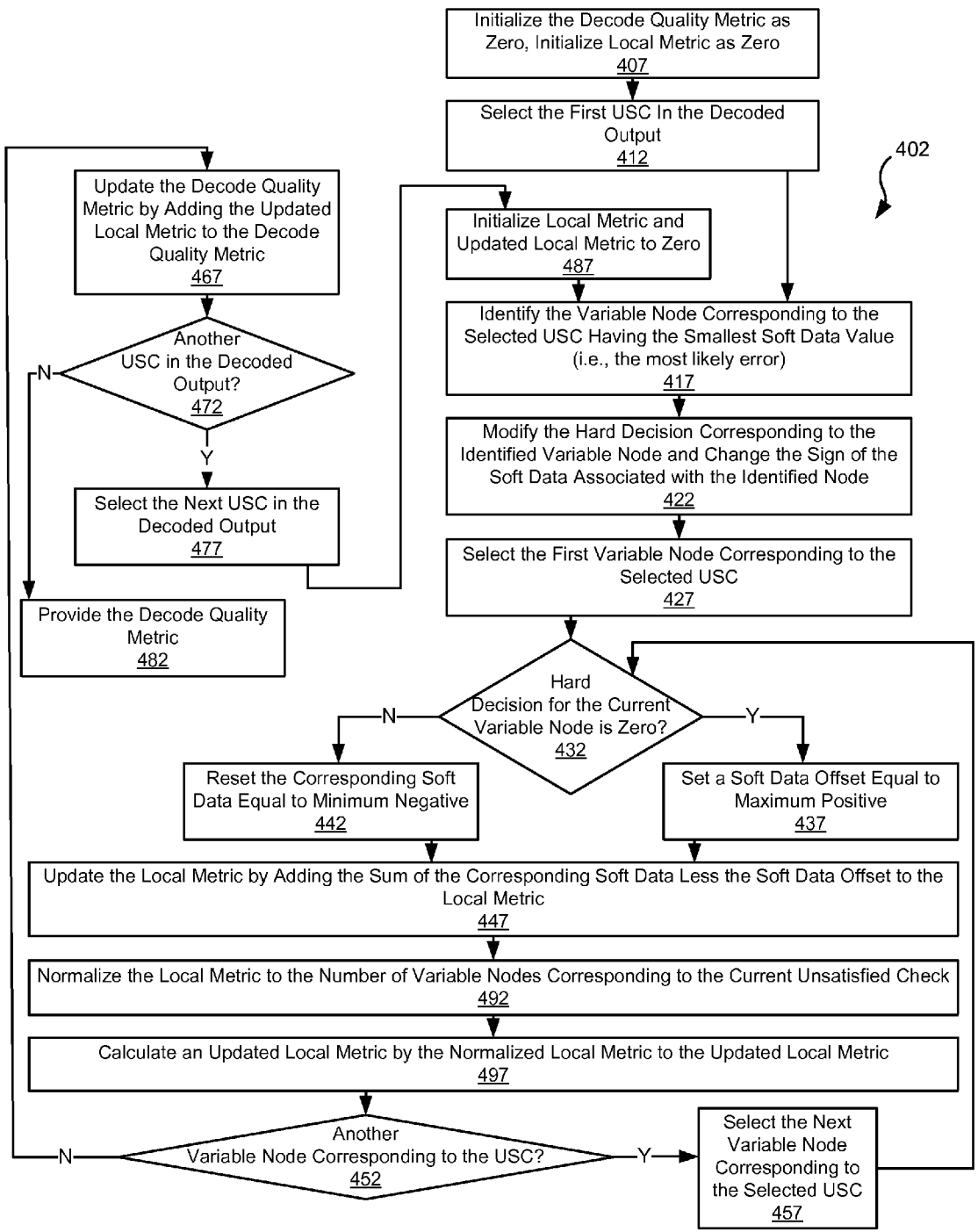

Turning to FIG. 4b, a flow diagram 401 shows a counterpart of the method described above in relation to FIG. 4a. Following flow diagram 401, in parallel to the previously described data detection process of FIG. 4a, it is determined whether a data decoder circuit is available (block 406). The data decoder circuit may be, for example, a low density data decoder circuit as are known in the art. Where the data decoder circuit is available (block 406), it is determined whether a derivative of a detected output is available for processing in the central memory (block 411). Where such a data set is ready (block 411), the previously stored derivative of a detected output is accessed from the central memory and used as a received codeword (block 416). A data decode algorithm is applied to the received codeword to yield a decoded output (block 421). Where a previous local iteration has been performed on the received codeword, the results of the previous local iteration (i.e., a previous decoded output) are used to guide application of the decode algorithm. It is then determined whether the decoded output converged (i.e., resulted in the originally written data) (block 426). Where the decoded output converged (block 426), it is provided as an output codeword (block 431). Alternatively, where the decoded output failed to converge (block 426), it is determined whether another local iteration is desired (block 436). In some cases, ten local iterations are allowed per each global iteration. Based upon the disclosure provided herein, one of ordinary skill in the art will recognize another number of local iterations that may be used in relation to different embodiments of the present invention. Where another local iteration is desired (block 436), the processes of blocks 406-436 are repeated for the codeword. Alternatively, where another local iteration is not desired (block 436), a decode quality metric is calculated based at least in part on soft data in the decoded output (block 441). This block is shown in dashed lines indicating that a flow diagram 402 of FIG. 4c shows additional detail of block 441. A derivative of the decoded output and the corresponding decode quality metric is stored to the central memory (block 446). The derivative of the decoded output being stored to the central memory triggers the data set ready query of block 405 to begin the data detection process.

Turning to FIG. 4c, a flow diagram 402 shows a method in accordance with some embodiments of the present invention for calculating the decode quality metric of block 441 of flow diagram 401 discussed above in relation to FIG. 4b. Following flow diagram 402, the decode quality metric is initialized to zero, and a local metric is initialized to zero (block 407). A first unsatisfied check in the decoded output is selected (block 412). A variable node connected to the unsatisfied check that exhibits the smallest soft data value (i.e., the variable node that is most likely incorrect) is identified (block 417). The hard decision corresponding to the identified variable node is modified, and the sign of the soft data associated with the identified node is changed (block 422). For example, for a binary decoded output, the hard decision is switched from 0 to 1, or from 1 to 0. In some cases where the soft data extends from −30 to +30, the sign of the soft data is switched. In contrast, where the soft data extends from, for example 0 to 60, instead of changing the sign of the soft data, a mid value (e.g., 30) is subtracted from the soft data value, the sign is then changed, and then the mid value is re-added to yield the updated value.

A first variable node corresponding to the selected unsatisfied checks is selected (block 427). It is determined whether the hard decision associated with the current variable node is zero (block 432). Where the current variable node is zero (block 432), a soft data offset is set equal to a maximum positive value (block 437). Thus, for example, where the value of the soft data extends from −30 to +30, the soft data offset is set equal to +30. Otherwise, where the current variable node is not zero (block 432), a soft data offset is set equal to a minimum negative value (block 442). Thus, using the same example, where the value of the soft data extends from −30 to +30, the soft data offset is set equal to −30. In either case, the local metric is updated by adding the sum of the soft data less the soft data offset to the local metric (block 447). The following equation describes the operation of block 447:

Local Metric=Local Metric+Soft Data Value−Soft Data Offset.

The local metric is then normalized to the number of variable nodes associated with the current unsatisfied check to yield a normalized local metric (block 492). The normalized local metric may be calculated in accordance with the following equation:

Normalized Local Metric=Local Metric/Number of Variable Nodes/Amplitude, where Amplitude is the amplitude (i.e., range) of the soft data (e.g., 60 where the soft data extends from −30 to +30). An updated local metric is then calculated by adding the normalized local metric to the updated local metric (block 497). This may be done in accordance with the following equation:

Updated Local Metric=Updated Local Metric+Normalized Local Metric.

It is determined whether another variable node corresponds to the selected unsatisfied check (block 452). Where another variable node remains (block 452), the next variable node corresponding to the unsatisfied check is selected (block 457), and the processes of blocks 432, 437, 442, 447, 492, 497 are repeated for the next variable node resulting in further updating of the local metric. Alternatively, where no additional variable nodes remain (block 452), the decode quality metric is updated by adding the updated local metric to the decode quality metric (block 467). The following equation describes the operation of block 467:

Decode Quality Metric=Decode Quality Metric+Updated Local Metric.

It is determined whether another unsatisfied check remains to be processed (block 472). Where another unsatisfied check remains (block 472), the next unsatisfied check is selected (block 477) and the local metric is re-initialized to zero in preparation for the next calculation (block 487), and the processes of blocks 417, 422, 427, 432, 437, 442, 447, 492, 497, 452, 467, 472 are repeated for the next unsatisfied check resulting in further updating of the decode quality metric. Alternatively, where no additional unsatisfied checks remain (block 472), the decode quality metric is provided (block 482).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for priority based data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
 a data decoder circuit operable to apply a data decode algorithm to a decoder input derived from a data set to yield a decoded output, wherein the decoded output includes an unsatisfied check, and soft data associated with the unsatisfied check; and
 a quality metric calculation circuit operable to calculate a quality metric corresponding to the data set using the soft data using the soft data to calculate a contribution from each variable node associated with the unsatisfied check to yield a local metric.

2. The system of claim 1, wherein the system further comprises:
 a data detector circuit operable to apply a data detection algorithm to the data set to yield a detected output, wherein the decoder input is derived from the detected output.

3. The system of claim 2, wherein the data detector circuit is selected from a group consisting of: a Viterbi algorithm data detector circuit, and a maximum a posteriori data detector circuit.

4. The system of claim 1, wherein the local metric is a first local metric, wherein the unsatisfied check is a first unsatisfied check, and wherein calculating the quality metric corresponding to the data set further comprises:
 using the soft data to calculate a contribution from each variable node associated with a second unsatisfied check to yield a second local metric; and
 summing a first interim metric derived from the first local metric and a second interim metric derived form the second local metric to yield the quality metric.

5. The system of claim 4, wherein the quality metric calculation circuit is further operable to:
 normalize the first local metric to a number of variable nodes corresponding the first unsatisfied check to yield the first interim metric; and
 normalize the second local metric to a number of variable nodes corresponding the second unsatisfied check to yield the second interim metric.

6. The system of claim 1, wherein the quality metric is a first quality metric; wherein the unsatisfied check is a first unsatisfied check; wherein the data set is a first data set, wherein the decoder input is a first decoder input; wherein the decoded output is a first decoded output; wherein the data decoder circuit is further operable to apply the data decode algorithm to a second decoder input derived from a second data set to yield a second decoded output; wherein the second decoded output includes a second unsatisfied check, and soft data associated with the second unsatisfied check; wherein the quality metric calculation circuit is further operable to calculate a second quality metric corresponding to the second data set using the soft data associated with the second unsatisfied check.

7. The system of claim 6, wherein the system further comprises:
 an input buffer operable to store the first data set and the second data set; and
 a scheduling circuit operable to select one of the first data set and the second data set for processing based at least in part on a comparison of the first quality metric and the second quality metric.

8. The system of claim 1, wherein the data decoder circuit is a low density parity check decoder circuit.

9. The system of claim 1, wherein the system is implemented as an integrated circuit.

10. The system of claim 1, wherein the system is incorporated in a device selected from a group consisting of: a storage device, and a data transmission device.

11. A method for data set quality determination, the method comprising:
 applying a data decode algorithm by a data decoder circuit to a decoder input derived from a data set to yield a decoded output, wherein the decoded output includes an unsatisfied check, and soft data associated with the unsatisfied check; and
 calculating a quality metric for the data set based at least in part on the soft data using the soft data to calculate a contribution from each variable node associated with the unsatisfied check to yield a local metric.

12. The method of claim 11, the method further comprising:
 applying a data detection algorithm to the data set to yield a detected output, wherein the decoder input is derived from the detected output.

13. The method of claim 11, wherein the local metric is a first local metric, wherein the unsatisfied check is a first unsatisfied check, and wherein calculating the quality metric corresponding to the data set further comprises: using the soft data to calculate a contribution from each variable node associated with a second unsatisfied check to yield a second local metric; and summing a first interim metric derived from the first local metric and a second interim metric derived from the second local metric to yield the quality metric.

14. The method of claim 13, wherein calculating the quality metric further comprises:
 normalizing the first local metric to a number of variable nodes corresponding the first unsatisfied check to yield the first interim metric; and
 normalizing the second local metric to a number of variable nodes corresponding the second unsatisfied check to yield the second interim metric.

15. The method of claim 11, wherein the quality metric is a first quality metric; wherein the unsatisfied check is a first unsatisfied check; wherein the data set is a first data set, wherein the decoder input is a first decoder input; wherein the decoded output is a first decoded output; and wherein the method further comprises:
 applying the data decode algorithm to a second decoder input derived from a second data set to yield a second decoded output, wherein the second decoded output includes a second unsatisfied check, and soft data associated with the second unsatisfied check; and
 calculating a second quality metric for the second data set based at least in part on the soft data associated with the second unsatisfied check.

16. The method of claim 11, wherein the method further comprises:
 selecting the data set for additional processing based at least in part on the quality metric.

17. A storage device, the storage device comprising:
 a storage medium;
 a head assembly disposed in relation to the storage medium and operable to provide a sensed signal corresponding to information on the storage medium;

a read channel circuit including:
  an analog to digital converter circuit operable to sample an analog signal derived from the sensed signal to yield a series of digital samples;
  an equalizer circuit operable to equalize the digital samples to yield a data set;
  a data decoder circuit operable to apply a data decode algorithm to a decoder input derived from the data set to yield a decoded output, wherein the decoded output includes an unsatisfied check, and soft data associated with the unsatisfied check; and
  a quality metric calculation circuit operable to calculate a quality metric corresponding to the data set using the soft data using the soft data to calculate a contribution from each variable node associated with the unsatisfied check to yield a local metric.

18. The storage device of claim 17, wherein the local metric is a first local metric, wherein the unsatisfied check is a first unsatisfied check, and wherein calculating the quality metric corresponding to the data set further comprises:
  using the soft data to calculate a contribution from each variable node associated with a second unsatisfied check to yield a second local metric; and
  summing a first interim metric derived from the first local metric and a second interim metric derived form the second local metric to yield the quality metric.

19. The storage device of claim 18, wherein the quality metric calculation circuit is further operable to:
  normalize the first local metric to a number of variable nodes corresponding the first unsatisfied check to yield the first interim metric; and
  normalize the second local metric to a number of variable nodes corresponding the second unsatisfied check to yield the second interim metric.

20. The storage device of claim 17, wherein the quality metric is a first quality metric; wherein the unsatisfied check is a first unsatisfied check; wherein the data set is a first data set, wherein the decoder input is a first decoder input; wherein the decoded output is a first decoded output; wherein the data decoder circuit is further operable to apply the data decode algorithm to a second decoder input derived from a second data set to yield a second decoded output; wherein the second decoded output includes a second unsatisfied check, and soft data associated with the second unsatisfied check; wherein the quality metric calculation circuit is further operable to calculate a second quality metric corresponding to the second data set using the soft data associated with the second unsatisfied check.

* * * * *